United States Patent [19]
Platzer et al.

[11] Patent Number: 5,183,723
[45] Date of Patent: Feb. 2, 1993

[54] COLORED IMAGE ON A DEGRADABLE SHEET MATERIAL AND METHOD OF FORMATION

[75] Inventors: Stephan J. W. Platzer, Califon; Arthur E. Procter, Long Valley, both of N.J.; Thomas Dunder, Chapel Hill, N.C.

[73] Assignee: Hoechst Celanese Corporation, Somerville, N.J.

[21] Appl. No.: 807,290

[22] Filed: Dec. 13, 1991

Related U.S. Application Data

[62] Division of Ser. No. 260,785, Oct. 21, 1988, Pat. No. 5,100,757.

[51] Int. Cl.$^5$ ............... C03F 7/021; C03F 7/023; C03F 7/032; G03C 5/18
[52] U.S. Cl. ............... 430/160; 430/141; 430/143; 430/155; 430/157; 430/158; 430/165; 430/166; 430/257; 430/271; 430/292; 430/293
[58] Field of Search ............ 430/141, 143, 155, 157, 430/293, 271, 292, 165, 166, 257, 158, 160

[56] References Cited

U.S. PATENT DOCUMENTS

| | | | |
|---|---|---|---|
| 3,721,557 | 3/1973 | Inoue | 430/143 |
| 3,764,318 | 10/1973 | Laridon | 430/143 |
| 3,775,113 | 11/1973 | Bonham et al. | 430/143 |
| 4,260,673 | 4/1981 | Krech | 430/143 |
| 4,596,755 | 6/1986 | Barton et al. | 430/257 |
| 4,650,738 | 3/1987 | Platzer et al. | 430/143 |
| 4,659,642 | 4/1987 | Platzer et al. | 430/143 |
| 4,748,101 | 5/1988 | Barton | 430/271 |
| 4,933,258 | 6/1990 | Shinozaki et al. | 430/271 |

Primary Examiner—Hoa Van Le
Assistant Examiner—Christopher G. Young
Attorney, Agent, or Firm—Richard S. Roberts

[57] ABSTRACT

This invention relates to a method for forming a colored image on a degradable sheet material. As a result, a negative- or positive-working color proofing sheet can be produced on a variety of printing paper stocks. Upon exposure to an actinic radiation source through a screened image and development, it can accurately reproduce the image on the degradable sheet. The construction is useful as a color proof which can be employed to accurately predict the image quality from a lithographic printing process on a variety of printing surfaces.

22 Claims, No Drawings

COLORED IMAGE ON A DEGRADABLE SHEET MATERIAL AND METHOD OF FORMATION

This is a divisional of copending application Ser. No. 07/260,785, filed on Oct. 21, 1988, now U.S. Pat. No. 5,100,757.

BACKGROUND OF THE INVENTION

In the graphic arts, it is desirable to produce a three or more color proof to assist in correcting a set of color separation films prior to using them to produce printing plates. The proof should reproduce the color quality that will be obtained during the printing process. The proof must be a consistent duplication of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. However, this conventional method of color proofing is costly and time consuming.

Photoimaging processes can also be used to produce color proofs. There are two general types of photoimaging methods; namely the overlay type and the single sheet type.

In an overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This is done by utilizing a single opaque support and by applying toners, transferring images, or processing solutions or coatings of photosensitive material of corresponding colors on the opaque support in succession. The single sheet method more closely resembles the actual printing process and eliminates the color distortion inherent in the overlay system.

The present invention relates to improved negative- and positiveworking proofing sheets of the solid layer transfer class. Color proofing films of this type are composed of a sheet substrate and at least a photosensitive member attached to the substrate. The photosensitive element is transferred to a receiver sheet by lamination generally with heat and pressure. After exposure, the transferred photosensitive element on the receiver sheet is developed preferably with an aqueous alkaline solution.

An example of a negative-working, solid transfer system is described in U.S. Pat. No. 4,650,738. The presensitized element comprises a substrate having a release surface, a pigmented photosensitive layer in contact with the release surface, and a heat sensitive adhesive layer in contact with the photosensitive layer. The element is laminated to a receiver sheet via the adhesive, the substrate peeled off, the photosensitive layer exposed, and the nonexposed areas removed during development with an aqueous, alkaline developer.

An example of a positive-working, solid transfer system is described in U.S. Pat. No. 4,659,642. The polymeric diazonium compound in the above negative-working element is replaced by a naphthoquinone diazide compound in the positive-working, presensitized element, while the other ingredients remain essentially the same. The positive-working element is processed in the manner as performed above.

In the solid transfer type of color proofing, the receiver sheet must undergo a high temperature and pressure lamination step. It must also undergo wet development. In a usual four color reproduction, the receiver sheet must undergo lamination and development repeatedly. Most printing papers cannot withstand these treatments and easily degrade. Therefore special, dimensionally stable and developer resistant receiver sheets, such as white opaque plastic films, are required. This is disadvantageous because the printer must judge the image quality on an artificial substrate rather than on the paper on which he ultimately intends to print. The present invention provides an improved method for producing an image on such a degradable receiver sheet whereby the desired receiver sheet is protected during the subsequent treatment steps. As a result virtually any paper stock can be used and the printer has an improved estimate of the quality of the image to be reproduced.

SUMMARY OF THE INVENTION

The present invention provides an improved method for forming a colored image on a degradable sheet material which comprises:

A. providing a receiver sheet composite formed by adhering two self-supporting, transparent, heat, pressure and developer resistant polymeric films having transparent, pressure or heat sensitive adhesive layers on only one side of the polymeric films to opposite sides of a degradable sheet material via the adhesive layers; and B. providing a photosensitive element which comprises in order:
  i) a substrate having a release surface; and
  ii) a photosensitive layer on said release surface, which photosensitive layer comprises a light sensitive component selected from the group consisting of negative working, polymeric diazonium compounds or positive working quinone diazide compounds or photopolymerizable compositions in an amount sufficient to photosensitize the layer; and a resinous binder composition in an amount sufficient to bind the layer components into a uniform film; and at least one colorant in an amount sufficient to uniformly color the layer; and
  iii) an optional, nonphotosensitive, colorless adhesive layer directly adhered to said colored photosensitive layer, which adhesive layer has a softening point in the range of from about 60° C. to about 180° C.; and C. either
  i) laminating said photosensitive element with heat and pressure via said photosensitive or adhesive layer of the photosensitive element to one side of said receiver sheet composite; and removing said substrate by the application of peeling forces; and imagewise exposing said photosensitive layer to actinic radiation; or
  ii) imagewise exposing said photosensitive layer to actinic radiation; and laminating said photosensitive element with heat and pressure via said photosensitive or adhesive layer of the photosensitive element to one side of said receiver sheet composite; and removing said substrate by the application of peeling forces; or
  iii) laminating said photosensitive element with heat and pressure via said photosensitive or adhesive layer of the photosensitive element to one side of said receiver sheet composite; and imagewise exposing said photosensitive layer to actinic radiation: and removing said substrate by the application of peeling forces; and thereafter D. removing the nonimage areas of said photosensitive layer with a liquid developer, which removing is conducted at a temperature at which said photosensitive element is substantially nontacky; and thereafter E. optionally repeating steps (A) through (D) at least once whereby another photosensitive element having at least one different colorant is laminated onto the nonremoved portions of the previously processed photosensitive layer or layers on the receiver sheet composite; and F. optionally repeating steps (A) through (E) with other photosensitive elements laminated, exposed, and developed on the other side of the receiver sheet composite.

The invention also provides a photosensitive article which is produced by the aforesaid method.

DETAILED DESCRIPTION OF THE PREFERRED EMBODIMENT

In carrying out the method of the invention, one employs a photosensitive element which broadly comprises a substrate having a release surface, a colored photosensitive layer on the release, surface, and an optional adhesive layer on the photosensitive layer. Optional additional layers containing antihalation materials, adhesion promoters, or release agents may also be used.

In the preferred embodiment, the substrate is composed of a dimensionally and chemically stable base material which does not significantly change its size, shape, or chemical properties as the result of the heating, coating, or other treatments which it must undergo. One preferred material is polyethylene terephthalate. In the usual case it has a thickness of from about 1 to about 10 mils, a more preferred thickness is from about 2 to about 5 mils, and most preferably from about 2 to about 3 mils. Suitable films include Hostaphan 3000, available from Hoechst Celanese Corporation; Mylar D, available from DuPont; and Melinex 516, available from ICI. The surface of the substrate may be smooth or may be provided with a matte texture by various methods known in the art.

Matte films include Melinex 377 and 470 from ICI. These materials have the unique property of giving the final image a desired matte finish without any extra steps. One can control the gloss of the final image by properly selecting the matte finish of the temporary support. This effect works because the top layer of the final image is originally in contact with this matte surface. An additional advantage of coating on a matte surface is that subsequent transferred layers generally adhere better to a rough surface than to a smooth surface.

A similar matte finish of the final image can be obtained by embossing the top surface of the image with a matte material, such as described above. This is done by laminating together the final image and matte material with heat and pressure. The matte material is then generally removed after lamination. The advantage of this method is that the finish of the final proof can be varied. Furthermore, the matting material can be used repeatedly.

A third method for producing a matte finish uses a heat transferable layer, such as Butvar 90, available from Monsanto, coated onto a film with a rough surface, such as Melinex 329, available from ICI. The transferable layer is laminated to the final image under pressure and temperature. Then the film with the rough surface is peeled off. The rough surface imparts a matte finish to the final image. An additional advantage is that the transferable layer protects the image. U.S. Pat. Nos. 4,294,909 and 4,376,159 also suggest various methods for making a matte surface.

In either case, the substrate must have a release surface, that is, it must be capable of releasably holding the photosensitive layer thereto. This may be accomplished either by the substrate surface being inherently releasable, being rendered releasable by a suitable treatment, or being provided with a release layer over the substrate surface. Such a release layer may comprise polyvinyl alcohol.

Releasably bonded to the release surface is the photosensitive layer. The photosensitive layer broadly comprises a photosensitizer, a colorant, a binding resin, and other optional ingredients such as plasticizers, stabilizers, surfactants, antistatic compositions, uv absorbers, photoactivators, antihalation agents, hydrogen atom donors, exposure indicators, optical brighteners, inert fillers, polymerization inhibitors, spectral sensitizers, and residual coating solvents.

In one embodiment, photosensitizer is preferably a light sensitive, negative working polymeric diazonium salt. The most preferred photosensitizer is the polycondensation product of 3-methoxy-4-diazo-diphenylamine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

In another embodiment, the photosensitizer is preferably a light sensitive, naphthoquinone diazide. The most preferred photosensitizer is the ester of bis-(3-benzoyl-4,5,6-trihydroxy phenyl)-methane and 2-diazo-1-naphthol-5-sulfonic acid as taught in U.S. Pat. No. 4,407,426. Other suitable photosensitizers are taught in U.S. Pat. No. 4,266,001; 3,106,365; 3,148,983 and 3,201,239. The diazo compounds of choice are preferably soluble in organic solvents.

In yet another embodiment, the photosensitizer comprises a photopolymerizable monomer or oligomer component, and a photoinitiator. Examples of such photosensitizers are given in U.S. Pat. No. 4,596,757.

The photopolymerizable material contained in the colored layer usually comprises an addition polymerizable, nongaseous (boiling temperature above 100° C. at normal atmospheric pressure), ethylenically-unsaturated compounds containing at least two terminal ethylene groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

Free radical liberating photoinitiators include any compound which liberates free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. No. 4,656,272.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm pink E (C.I. 73915), Hostaperm Red Violet ER (C.I. 46500), Permanent Carmine FBB (C.I. 12485), Hostaperm Blue B2G (C.I. 74160), Hostaperm Blue A2R (C.I. 74160), and Printex 25. Most of these pigments are products of Hoechst AG. They can be used separately or blended for a desired color.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional.

Dyes may be included to spectrally sensitize the photoinitiator, such as described in U.S. Pat. Nos. 4,282,309 and 4,454,218, and European Patent Applications 0,179,448 and 0,211,615.

In the practice of the present invention, the binder component is preferably present in the photosensitive layer in an amount sufficient to bind the composition components in a uniform mixture and a uniform film when it is coated on a substrate. It is preferably present in an amount ranging from about 10% to about 80% based on the weight of the solids in the layer. A more preferred range is from about 20% to about 70%.

In the preferred embodiment, when a diazonium salt or diazide compound is the photosensitizer component, it is present in the photosensitive layer in an amount of from about 5 to about 70 percent by weight; more preferably from about 10 to about 50 percent by weight.

In the practice of the present invention, when a photoinitiator compound is used, it is preferably present in the photosensitive layer in a amount sufficient to initiate the free radical polymerization of the unsaturated component upon exposure to imaging energy. It is preferably present in an amount ranging from about 2% to about 30% based on the weight of the solids in the layer. A more preferred range is from about 6% to about 20%.

In the practice of the present invention, the colorant component is preferably present in an amount sufficient to uniformly color the photosensitive layer. It is preferably present in an amount ranging from about 5% to about 50% based on the weight of the solids in the layer. A more preferred rang is from about 10% to about 40%.

In the practice of the present invention, when an unsaturated component is used, it is preferably present in the photosensitive layer in an amount sufficient to cause an imagewise latent differential in the polymerizable composition when it is coated on a substrate and imagewise exposed to imaging energy. It is preferably present in an amount ranging from about 10% to about 60% based on the weight of the solids in the layer. A more preferred range is from about 15% to about 40%.

Suitable acid stabilizers useful within the context of this invention include phosphoric, citric, benzoic, m-nitro benzoic, p(p-anilino phenylazo) benzene sulfonic acid, 4,4,-dinitro-2,2'-stilbene disulfonic, itaconic, tartaric and p-toluene sulfonic acid and mixtures thereof. Preferably, the acid stabilizer is phosphoric acid.

Exposure indicators (or photoimagers) which may be useful in conjunction with the present invention include 4-phenylazodiphenylamine, eosin, azobenzene, Calcozine Fuchine, Crystal Violet, and Methylene Blue dyes. Preferably, the exposure indicator is 4-phenylazodiphenylamine.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4- dimethylamino benzoate, 2-(dimethylamino) amino benzoate, and acrylated amines.

A plasticizer may also be included in the composition of this invention to prevent coating brittleness to keep the composition pliable if desired. Suitable plasticizers include dibutylphthalate, dioctylphthalate, triarylphosphate and substituted analogs thereof.

To form a coating composition for the production of the photosensitive elements, the composition of this invention may be dissolved in a solvent or mixture of solvents to facilitate application of the composition to the substrate. Suitable solvents for this purpose may include water, tetrahydrofuran, gamma butyrolactone, glycol ethers such as propylene glycol monomethyl ether and methyl cellosolve, alcohols such as ethanol and n-propanol and ketones such as methyl ethyl ketone. In general, the solvent system is evaporated from the coating composition once it is applied to an appropriate substrate. However, some insignificant amount of solvent may remain as residue.

In the preferred embodiment, the photosensitive layer has a coating weight between approximately 0.1 and 5.0g/m². The most preferred weight is from about 0.5 to 2.0g/m².

The purpose of the optional adhesive layer on the photosensitive layer is to aid in the transfer of the photosensitive layer and to protect the integrity of underlying, previous formed images during development of subsequent layer or layers. It may be applied to the photosensitive layer in several different ways. It can be coated directly onto the photosensitive layer out of organic or aqueous based solvent mixtures, or it can be applied by hot melt extrusion, lamination, or coating. The optional adhesive layer preferably comprises a major amount of one or more thermoplastic polymers and may optionally contain such other desired components as uv absorbers, antistatic compositions, optical brighteners, inert fillers, and plasticizers. Suitable polymers nonexclusively include vinyl acetal resins such as Butvar B-79 available from Monsanto; acrylic resins such as Elvacite 2044 available from DuPont; ethylene resins such as Elvax 210 available from DuPont; and vinyl chloride resins such as Hostaflex CM 133 available from Hoechst AG. Preferably the polymer is a vinyl acetate polymer or copolymer.

Useful polyvinyl acetates nonexclusively include Mowilith DM-6, DM-22, 20, 25, 30 and mixtures thereof, available from Hoechst AG. These are usually dispersed in water, or dissolved in methyl isobutyl ketone or n-butyl acetate or other solvent compositions for coating on the photosensitive layer. It is then dried to a coating weight of from about 2 to about 30g/m², more preferably from about 4 to about 20g/m². The layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. It may also contain other resins such as Nitrocellulose RS ½, available from Hercules. The adhesive layer should not be tacky to the touch, during storage or during development of the photosensitive element. The layer should be transferable in the range of from about 60° C. to 180° C., preferably 60° C. to 120° C., more preferably 60° C. to 100° C. when laminated with heat and pressure. In the preferred embodiment, the thermoplastic polymer or polymers are present in the adhesive layer in an amount of greater than about 50% by weight. The plasticizer may be present in an amount of up to about 30% by weight, the uv absorber up to about 20% by weight, and other resins up to about 50% by weight.

Typical adhesive formulations for the photosensitive element nonexclusively include.

|      |                  |       |
|------|------------------|-------|
| I.   | Water            | 50.00 |
|      | Mowilith DM-22   | 50.00 |
| II.  | n-butyl acetate  | 78.00 |
|      | Resoflex R-296   | 1.00  |
|      | Mowilith 30      | 21.00 |
| III. | n-butyl acetate  | 68.70 |
|      | Uvinul D-50      | 1.30  |
|      | Mowilith 20      | 30.00 |
| IV.  | n-butyl acetate  | 85.00 |
|      | Mowilith 60      | 15.00 |

The receiver sheet composite which is formed starts with a degradable sheet material such as paper which absorbs a developing solution or a dimensionally unstable film such as polypropylene which shrinks when heated. One then provides two transparent self supporting, heat and developer resistant, transparent films preferably of an organic polymer layer, of between 0.7 to 5 mils in thickness. Preferably the layer is between 1 to 4 mils, and most preferably between 1.5 and 3 mils. The composition of the film is unimportant.

One preferred material is polyethylene terephthalate. Suitable films include Melinex 054, 504, 505, 582 available from ICI; and Hostaphen 4400, 4500, and 4540 available from Hoechst AG. The films are preferably adhesion promoted on both sides. Examples of adhesion pretreatment subbing layers are disclosed in U.S. Pat. No. 2,627,088.

On one side of the transparent film is a transparent, pressure or heat sensitive adhesive layer. The adhesive is preferably colorless and developer resistant. This layer comprises a major amount of one or more thermoplastic polymers. Virtually any thermoplastic polymer may be used for this purpose provided it is capable of adhering to a degradable receiver sheet material as described. Suitable thermoplastic polymers nonexclusively include those previously described for the photosensitive element. Other suitable thermoplastic polymers include ethylene/vinyl acetate copolymers such as Elvax 40-W and 150-W available from DuPont. Two of such transparent films are then adhered to each side of the degradable sheet material via the adhesive layers to form the composite.

Typical adhesive formulations for the receiver sheet nonexclusively include by weight:

|      |                     |       |
|------|---------------------|-------|
| I.   | n-butyl acetate     | 78.00 |
|      | Resoflex R-296      | 1.00  |
|      | Mowilith 30         | 21.00 |
| II.  | toluene             | 90.00 |
|      | Elvax 150-W         | 10.00 |
| III. | methyl ethyl ketone | 90.00 |
|      | Hostaflex CM 133    | 10.00 |

In operation, the photosensitive element is laminated to one side of the receiver sheet composite via the photosensitive layer or adhesive layer of the photosensitive element if present. Optionally another image can be prepared simultaneously on the other side of the composite.

Lamination ma be conducted by putting together the photosensitive element and receiver sheet composite in the proper configuration and then introducing the two materials into the nip of a pair of heated laminating rollers under suitable pressure. Suitable laminating temperatures usually range from about 60° C. to about 180° C., preferably about 60° C. to about 120° C. After lamination, the substrate is peeled away, usually merely employing manual peeling forces. The photosensitive layer plus the adhesive layer of the photosensitive element when used thus remains on top of the composite.

The photosensitive layer is imaqewise exposed by means well known in the art either before or after lamination. Such exposure may be conducted by exposure to a uv light source through a color separation under vacuum frame conditions. Exposures after lamination and peel apart are preferred for emulsion-to-photosensitive layer contact. Mercury vapor discharge lamps are preferred over metal halide lamps. Other radiation sources, such as carbon arc, pulsed xenon, and lasers, may also be used. Light absorbing filters may be used to reduce light scattering in the material.

After transfer and exposure, the photosensitive layer is developed by dissolving the nonimage areas in a suitable developer and dried. Suitable developers nonexclusively include:

| | |
|---|---|
| I. water | 95.0 |
| sodium decyl sulphate | 3.0 |
| disodium phosphate | 1.5 |
| sodium metasilicate | 0.5 |
| II. water | 89.264 |
| monosodium phosphate | 0.269 |
| trisodium phosphate | 2.230 |
| sodium tetradecyl sulfate | 8.237 |

Any developer solution which satisfactorily removes the nonimage areas of the photosensitive layer after exposure while retaining the image areas may be used. The selection of developer is well within the ability of the skilled artisan. Development is performed at temperatures below that at which the photosensitive element is nontacky.

The process can then be repeated whereby another photosensitive element having a different color is laminated to the same receiver sheet composite over the previously formed image. In the usual case, four colored layers are employed to produce a full color reproduction of a desired image. These are cyan, magenta, yellow and black. Optionally one can laminate a protective layer over the thusly produced image.

The following nonlimiting examples serve to illustrate the invention.

EXAMPLE 1

An adhesive solution for the receiver sheet composite is produced according to the adhesive formulation II as described above. The solution is coated and then dried onto two 3 mil Melinex 505 polyester films at a dry coating weight of approximately 6g/m². One of the transparent films is laminated to one side of a sheet of Mead 2 S (70) paper while the other transparent film is laminated to the opposite side of the paper, via the adhesive layers. The paper, which is degradable in the developer, is smaller than the films to ensure a good seal at the edges.

Four negative-working photosensitive solutions of cyan, yellow, magenta, and black are produced according to the following formulations.

| | Cyan | Yellow | Magenta | Black |
|---|---|---|---|---|
| methyl cellosolve | 41.00 | 41.00 | 46.50 | 41.00 |
| methyl ethyl ketone | 41.00 | 40.99 | 46.48 | 41.00 |
| gamma-butyrolactone | 10.00 | 10.00 | — | 10.00 |
| dimethyl phthalate | 0.75 | 0.75 | 0.88 | 0.75 |
| dibutyl phthalate | 0.25 | 0.25 | — | 0.25 |
| p-toluene sulfonic acid | — | — | 0.18 | 0.35 |
| Scripset 540 | 3.33 | 2.60 | 3.15 | 3.71 |
| Scripset 550 | 1.17 | — | — | — |
| hydrolyzed Scripset 540 | — | — | 0.67 | — |
| SMA 2625 | — | 2.02 | — | — |
| Above diazo from U.S. Pat. No. 3,849,392 | 1.33 | 1.35 | 0.70 | 2.00 |
| phthalo blue pigment | 1.17 | — | — | — |
| yellow pigment | — | 1.04 | — | — |
| magenta pigment | — | — | 1.44 | — |
| black pigment | — | — | — | 0.94 |
| optical density | 1.1 | 0.9 | 1.2 | 1.5 |

Scripset resins are from Monsanto. SMA resin is available from Arco.

The pigment is introduced as a dispersion of methyl ethyl ketone, Scripset 540, and the appropriate pigment. The solutions are coated and dried separately to the required optical density onto 3 mil Melinex 516 polyester films as temporary substrates. The surface densities are roughly 1.3g/m² for cyan, 0.9g/m² for yellow, 1.8g/m² for magenta, and 1.2g/m² for black. The adhesive solution, in particular adhesive formulation II, for the photosensitive element as described above, is coated on top of the photosensitive layers and dried to a surface density of 12g/m². The yellow composite is then laminated at 80° C. with the adhesive side onto one side of the receiver sheet composite. The temporary 516 support is peeled away after lamination, leaving the adhesive and photosensitive layers on the receiver sheet composite. The yellow photosensitive layer is then exposed to actinic light through a negative color separation for the yellow color. The receiver sheet composite with the exposed yellow layer is then immersed for 15 seconds in developer II as described above at 27° C. with gentle pad rubbing on the photosensitive side. The nonexposed, yellow areas are thereby washed off and the exposed areas remain during development. The adhesive layer is not effected by the developer. After this treatment, the imaged material is rinsed and then dried. The magenta composite is then laminated as before onto the yellow image on the receiver sheet composite. The temporary support is removed as before. The magenta layer is then exposed through the magenta separation. It is then processed as with the yellow. The magenta is followed in a like manner by cyan and then by black to give a four color image on paper which is an accurate duplicate of a printed image using the same type of paper.

EXAMPLE 2

An adhesive solution for the receiver sheet composite is produced according to the adhesive formulation I as described above. The solution is coated and then dried onto two 2 mil Melinex 393 transparent polyester films at a dry coating weight of approximately 12g/m². The transparent films are laminated to both sides of a sheet of Mead 2 S (70) paper via the adhesive layers, with one transparent film on each side.

Four positive-working photosensitive solutions of cyan, yellow, magenta, and black are produced according to the following formulations.

| | Cyan | Yellow | Magenta | Black |
|---|---|---|---|---|
| diacetone alcohol | — | 11.74 | — | — |
| methyl ethyl ketone | 35.52 | 34.45 | 24.23 | 38.62 |
| gamma butyrolactone | 22.60 | 11.15 | 24.04 | 5.74 |
| Dowanol PM | 34.76 | 35.21 | 44.94 | 48.34 |
| Scripset 540 | 1.60 | 2.01 | 2.15 | 2.39 |
| SMA 2625 | 1.74 | 1.17 | — | 0.60 |
| Butvar B-90 | 0.58 | 0.59 | 0.67 | 0.30 |
| Above diazo from U.S. Pat. No. 4,407,426 | 2.09 | 2.58 | 2.81 | 2.72 |
| phthalo blue pigment | 1.11 | — | — | — |
| yellow pigment | — | 1.08 | — | — |
| magenta pigment | — | — | 1.15 | — |
| black pigment | — | — | — | 1.29 |
| optical density | 1.2 | 1.0 | 1.4 | 1.6 |

Scripset resins are available from Monsanto, SMA resin is available from Arco, and Dowanol PM is propylene glycol monomethyl ether available from Dow.

The pigment is introduced as a dispersion of methyl ethyl ketone, Scripset 540, and the appropriate pigment.

The solutions are coated and dried separately to the required optical density onto 3 mil Melinex 516 polyester films as temporary substrates. The surface densities are roughly 1.2g/m2 for cyan, 1.4g/m$^2$ for yellow, 2.0g/m$^2$ for magenta, and 1.0g/m$^2$ for black. The adhesive solution, in particular adhesive formulation II for the photosensitive element as described above, is coated on top of the photosensitive layers and dried to a surface density of 8g/m$^2$. The yellow composite is then laminated at 80° C. with the adhesive side onto one side of the receiver sheet composite. The 516 temporary support is peeled away after lamination, leaving the adhesive and photosensitive layers on the receiver sheet composite. The yellow photosensitive layer is then exposed to actinic light through a positive color separation for the yellow color. The receiver sheet composite with the exposed yellow layer is then immersed for 15 seconds in the developer II as described above at 27° C. with gentle pad rubbing on the photosensitive side. The exposed, yellow areas are thereby washed off and the nonexposed areas remain during development. The adhesive layer is not affected by the developer. After this treatment, the imaged material is rinsed and then dried. The magenta composite is then laminated as before onto the yellow image on the receiver sheet composite. The temporary support is removed as before. The magenta layer is then exposed through the magenta separation. It is then processed as with the yellow. The magenta is followed in a like manner by cyan and then by black to give a four color image on paper which is an accurate duplicate of a printed image using the same type of paper.

What is claimed is:

1. A photosensitive article which comprises a colored image on a degradable sheet material, said article prepared by a. providing a receiver sheet composite formed by adhering two self-supporting, transparent, heat, pressure and developer resistant polymeric films having transparent, pressure or heat sensitive adhesive layers on only one side of the polymeric films to opposite sides of a degradable sheet material via the adhesive layers; and b. providing a photosensitive element which comprises in order:

i) a substrate having a release surface; and ii) a photosensitive layer on said release surface, which photosensitive layer comprises a light sensitive component selected from the group consisting of negative working, polymeric diazonium compounds or positive working quinone diazide compounds or photopolymerizable compositions in an amount sufficient to photosensitive the layer; and a resinous binder composition in an amount sufficient to bind the layer components into a uniform film; and at least one colorant in an amount sufficient to uniformly color the layer; and iii) an optional, nonphotosensitive, colorless adhesive layer directly adhered to said colored photosensitive layer, which adhesive layer has a softening point in the range of from about 60° C. to about 180° C.; and c. either i) laminating said photosensitive element with heat and pressure via said photosensitive or adhesive layer of the photosensitive element to one side of said receiver sheet composite; and removing said substrate by the application of peeling forces; and imagewise exposing said photosensitive layer to actinic radiation to thereby produce image areas in either the exposed or unexposed areas and oppositely non-image areas in either the unexposed or exposed areas; or ii) imagewise exposing said photosensitive layer to actinic radiation to thereby produce image areas in either the exposed or unexposed areas and oppositely non-image areas in either the unexposed or exposed areas; and laminating said photosensitive element with heat and pressure via said photosensitive or adhesive layer of the photosensitive element to one side of said receiver sheet composite; and removing said substrate by the application of peeling forces; or iii) laminating said photosensitive element with heat and pressure via said photosensitive or adhesive layer of the photosensitive element to one side of said receiver sheet composite; and imagewise exposing said photosensitive layer to actinic radiation to thereby produce image areas in either the exposed or unexposed areas and oppositely nonimage areas in either the unexposed or exposed areas; and removing said substrate by the application of peeling forces; and thereafter d. removing the nonimage areas of said photosensitive layer produced in step (c) with a liquid developer, which removing is conducted at a temperature at which said photosensitive element is substantially nontacky; wherein the image areas are in the exposed areas and the non-image areas are in the unexposed areas when the light sensitive component is a negative working, polymeric diazonium compound or a photopolymerizable composition, and the image areas are in the unexposed areas and the non-image areas are in the exposed areas when the light sensitive component is a positive working quinone diazide compound; and thereafter e. optionally repeating steps (b) through (d) at least once whereby another photosensitive element produced according to step (b) having at least one different colorant is laminated onto the nonremoved image portions of the previously processed photosensitive layer or layers on the receiver sheet composite; and f. optionally repeating steps (b) through (e) with other photosensitive elements produced according to step (b) which are laminated, exposed, and developed on the other side of the receiver sheet composite.

2. The article of claim 1 wherein said substrate comprises polyethylene terephthalate.

3. The article of claim 1 wherein said substrate has a matte surface.

4. The article of claim 1 wherein said release surface on said substrate comprises polyvinyl alcohol.

5. The article of claim 1 wherein said photosensitive layer comprises the polycondensation product of 3-methoxy-4-diazodiphenylamine sulfate and 4,4'-bis-methoxymethyl-diphenyl ether precipitated as mesitylene sulfonate.

6. The article of claim 1 wherein said photosensitive layer comprises the ester of bis-(3-benzoyl-4,5,6-trihydroxy phenyl)-methane and 2-diazo-1-naphthol-5-sulfonic acid.

7. The article of claim 1 wherein said photosensitive layer comprises a photoinitiator and a polymerizable monomer.

8. The article of claim 7 wherein said photoinitiator comprises one or more compounds selected from the group consisting of 2,3-di(4-methoxyphenyl)quinoxaline, 9-phenyl acridine, bis(2,4,5-triphenyl)imidazole, and their derivatives.

9. The article of claim 7 wherein said polymerizable monomer comprises one or more compounds selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

10. The article of claim 1 wherein said binders in the photosensitive layer comprises one or more compounds selected from the group consisting of polyvinyl acetals; styrene/maleic anhydride copolymers and their half esters; and acrylic resins.

11. The article of claim 1 wherein said photosensitive layer further comprises one or more ingredients selected from the group consisting of plasticizers, stabilizers, antistatic compositions, uv absorbers, dyes, pigments, surfactants, photoactivators, antihalation agents, hydrogen atom donors, exposure indicators, optical brighteners, inert fillers, polymerization inhibitors, spectral sensitizers, and residual coating solvents.

12. The article of claim 1 wherein the coating weight of the photosensitive layer ranges from about 0.1 to about 5.0g/m$^2$.

13. The article of claim 1 wherein said optional adhesive layer of the photosensitive element comprises one or more thermoplastic polymers.

14. The article of claim 1 wherein said optional adhesive layer of the photosensitive element further comprises one or more ingredients selected from the group consisting of plasticizers, uv absorbers, antistatic compositions, inert fillers, antihalation agents, and optical brighteners.

15. The article of claim 1 wherein the adhesive layer of the photosensitive element has a coating weight of from about 2 to about 30g/m$^2$.

16. The article of claim 1 wherein said self supporting polymeric film of the receiver sheet composite has a thickness of from about 0.7 to about 5 mils 17. The article of claim 1 wherein said self supporting polymeric film of the receiver sheet composite comprises polyethylene terephthalate.

18. The article of claim 1 wherein the adhesive layer on the polymeric film comprises one or more thermoplastic polymers.

19. The article of claim 1 wherein said adhesive layer on the polymeric film further comprises one or more ingredients selected from the group consisting of plasticizers, uv absorbers, antistatic compositions, inert fillers, antihalation agents, and optical brighteners.

20. The article of claim 1 wherein said adhesive layer on the polymeric film has a coating weight of from about 2 to about 30g/m$^2$.

21. The article of claim 1 wherein said degradable sheet material comprises paper or plastic coated paper.

22. The article of claim 1 wherein the laminating step is conducted at a temperature of from about 60° C. to about 180° C.

* * * * *